(12) United States Patent
Lee et al.

(10) Patent No.: US 8,842,017 B2
(45) Date of Patent: Sep. 23, 2014

(54) DEVICE AND METHOD FOR DISPLAYING THE LIFECYCLE OF A SURGE PROTECTION DEVICE

(75) Inventors: Myung Wook Lee, Gyeonggi-do (KR); Young Jun Lee, Incheon (KR); Sei Hyun Lee, Daejeon (KR)

(73) Assignee: Sungjin Techwin Co., Ltd., Daejeon (KR)

( * ) Notice: Subject to any disclaimer, the term of this patent is extended or adjusted under 35 U.S.C. 154(b) by 9 days.

(21) Appl. No.: 13/805,560

(22) PCT Filed: Feb. 23, 2011

(86) PCT No.: PCT/KR2011/011175
§ 371 (c)(1),
(2), (4) Date: Dec. 19, 2012

(87) PCT Pub. No.: WO2012/091215
PCT Pub. Date: Jul. 5, 2012

(65) Prior Publication Data
US 2013/0093595 A1 Apr. 18, 2013

(30) Foreign Application Priority Data
Dec. 28, 2010 (KR) .......................... 10-2010-0137110

(51) Int. Cl.
G08B 21/00 (2006.01)
G08B 21/18 (2006.01)
H02H 9/04 (2006.01)

(52) U.S. Cl.
CPC .............. *G08B 21/18* (2013.01); *H02H 9/042* (2013.01); *H02H 9/041* (2013.01)
USPC ................... 340/635; 340/636.1; 340/636.11; 340/636.12; 340/636.13; 340/636.14; 340/636.15; 340/636.16; 340/636.17; 340/636.18; 340/636.19; 340/657; 340/658; 340/659; 340/660; 340/661; 340/662; 340/663; 340/664; 324/117 R; 324/550; 361/93.1; 361/118; 361/119

(58) Field of Classification Search
USPC ................. 340/635, 636.1–636.19, 657–664; 324/117 R, 550; 361/93.1, 118, 119
See application file for complete search history.

(56) References Cited

U.S. PATENT DOCUMENTS 5,508,619 A * 4/1996 Ozawa et al. .................. 324/535
5,521,603 A * 5/1996 Young ........................... 342/198

(Continued)

FOREIGN PATENT DOCUMENTS

JP 2003047144 A * 2/2003 ............... H02H 3/08
KR 10-0863668 B1 10/2008

(Continued)

*Primary Examiner* — George Bugg
*Assistant Examiner* — Paul Obiniyi
(74) *Attorney, Agent, or Firm* — Rabin & Berdo, P.C.

(57) ABSTRACT

The present invention relates to a device and method for displaying the lifecycle of a surge protection device, and more particularly to a device and method for displaying the lifecycle of a surge protection device, which detects an increase in leakage current according to a deterioration in performance of the surge protection device in order to provide notice of a replacement time for the surge protection device. According to the present invention, it is possible to for a user to provide notice of a replacement time by displaying the lifecycle of a surge protection device (SPD) to the outside. Additionally, as another effect of the present invention, it is possible to confirm an amount of leakage current flowing into the ground of the SPD and whether the SPD is properly installed on a ground line by using a current and ground state detecting sensor.

10 Claims, 4 Drawing Sheets

(56) References Cited

U.S. PATENT DOCUMENTS

| | | | |
|---|---|---|---|
| 6,404,348 B1* | 6/2002 | Wilfong | 340/657 |
| 6,476,618 B1* | 11/2002 | Chou | 324/550 |
| 6,628,113 B2* | 9/2003 | Gallavan | 324/102 |
| 6,879,478 B2* | 4/2005 | Mendoza et al. | 361/93.1 |
| 7,751,169 B2* | 7/2010 | Qin et al. | 361/119 |
| 2002/0048134 A1* | 4/2002 | Nemoto et al. | 361/119 |
| 2002/0153989 A1* | 10/2002 | Chou | 337/159 |
| 2002/0167302 A1* | 11/2002 | Gallavan | 324/117 R |
| 2003/0016004 A1* | 1/2003 | Jungwirth et al. | 324/113 |
| 2004/0085696 A1* | 5/2004 | Mendoza et al. | 361/93.1 |
| 2006/0202980 A1* | 9/2006 | Wu | 345/204 |
| 2006/0232906 A1* | 10/2006 | Sueoka | 361/118 |
| 2010/0201899 A1* | 8/2010 | Yamamoto | 349/40 |

FOREIGN PATENT DOCUMENTS

| | | |
|---|---|---|
| KR | 10-2008-0102083 A | 11/2008 |
| KR | 10-1002073 B1 | 12/2010 |

* cited by examiner

DEVICE AND METHOD FOR DISPLAYING THE LIFECYCLE OF A SURGE PROTECTION DEVICE

TECHNICAL FIELD

The present invention relates to a device and method for displaying the lifecycle of a surge protection device, and in particular to a device and method for displaying the lifestyle of a surge protection device which make it possible to inform a replacement timing of a surge protection device in such a way to detect the increase in a leakage current due to a performance deterioration of a surge protection device.

BACKGROUND ART

A SPD (Surge Protection Device) is directed to protecting the damages of a certain system from a surge voltage which generally occurs due to lightening, etc. Most of the current electric devices, electronic circuits, communication devices, etc. are configured to include an integrated circuit having low power and high integrations, so they might be easily damaged by a relatively low surge voltage.

It is a trend that many products are equipped with a surge protection device for the purpose of effectively protecting the internal circuits from a surge voltage. The above mentioned surge protection device generally comprises a diverting type device like a lightening rod configured to limit an overvoltage with a breakdown device by diverting a propagation route of an over current occurring on a line to the ground, a blocking type device generally formed of a resistor or an inductor configured to prevent an overvoltage from transferring to a system which will be protected, by limiting the passage of an over current, and a clamping type device of a MOV (Metal Oxide Varistor) or a constant voltage diode, etc. which are generally configured to limit a certain level of incoming overvoltage to a limited voltage of the device.

In case of the above described surge protection device, the lifespan of a surge protection device is determined depending on the number of lightening or surge inputs or the level of lightening surges. For this reason, a surge protection device installed one month ago might be replaced with a new one In the event that the surge protection device is not replaced for the sake of a continuous use, the surge absorption device (for example, MOV, Varistor, etc.) installed in the surge protection device might be degraded, so a short circuit, not a disconnection, occurs as the lifespan ends, which consequently results in a formation of a closed circuit for thereby causing ignition or explosion. The problem encountered in the conventional art is that it is impossible to know or estimate the lifespan of a surge protection device. The lifespan of the surge protection device can be known only when damages actually occur and are visually checked.

According to the conventional surge protection device, it is impossible to check the amount of the leakage currents flowing to the ground, due to which the electric power might be unnecessarily consumed for the leakage currents.

In addition, it is impossible to check whether the surge protection device is properly installed on the ground line, so the normal operations of the installed surge protection device cannot be checked.

According to the conventional surge protection device, it is impossible to obtain the date and time-based statistic data on the leakage current of the surge protection device, the number of surge occurrences, the levels of the surges, and the ground states.

DISCLOSURE OF INVENTION

Accordingly, the present invention is made to improve the problems encountered in the conventional art. It is an object of the present invention to provide a device and method for displaying the lifecycle of a surge protection device which make it possible to provide a replacement timing of a surge protection device.

It is another object of the present invention to provide a device and method for displaying the lifecycle of a surge protection device which make it possible to check the amount of leakage current flowing to the ground and to check whether the surge protection device is properly installed on the ground line.

It is further another object of the present invention to provide a device and method for displaying the lifecycle of a surge protection device which help collect the date and time-based statistic data on the leakage current of a surge protection device, the number of surge occurrences, the levels of surges, the ground states, etc.

To achieve the above objects, there is provided a device for displaying the lifecycle of a surge protection device, comprising a surge detection sensor detecting a surge input inputted into a surge protection device; a surge detection unit connected with the surge detection sensor for generating a surge input detection information; a controller receiving the surge input detection information and judging the current state of the surge protection device from the surge input detection information and generating a surge protection device state information; and a display unit displaying the surge protection device state information.

To achieve the above objects according to another embodiment of the present invention, there is provided a method for displaying the lifestyle of a surge protection device, comprising a detection step for a surge detection sensor to detect a surge input inputted from a surge protection device; a surge input detection generation step for a surge detection unit to be connected with the surge detection sensor and to generate a surge input detection information; a surge protection device state information generation step for a controller receives the surge input detection information and to judge the current state of the surge protection device from the surge input detection information and to generate a surge protection device state information; and a surge protection device state information display step for a display unit to display the surge protection device state information.

At this time, the surge detection sensor detects the current flowing from the surge protection device to the ground.

Here, the surge input detection information is at least one among the leakage current of the surge protection device, the ground state, the number of surges and the level of the surge.

In addition, the surge protection device state information is either an information indicating the normal, alarm and replacement depending on the number of the surges or the level of the surge or an information indicating the lifespan of the surge protection device in a combined form of numbers and characters.

In addition, the device for displaying the lifestyle of a surge protection device further comprises a RTC (Real Time Clock) module providing a time information to the controller; a memory storing the surge input detection information and the surge protection device state information; and a communication means for externally transmitting the surge input detection information and the surge protection device state information.

At this time, the display unit is formed of any one of a FND (Flexible Numeric Display), a LED (Light Emitting Diode), a LCD (Liquid Crystal Display) and an OLED (Organic Light Emitting Diode).

In addition, the device for displaying the lifestyle of a surge protection device further comprises a temperature fuse which is connected with the input line of the surge protection device and is disconnected when it exceeds a certain temperature level; and an AC/DC (Alternating Current/Direct Current connected with the temperature fuse and providing an electric power to the controller.

Advantageous Effects

The present invention has advantageous features in that it is possible to check the replacement timing of a surge protection device by displaying the lifespan of the surge protection device.

As another advantageous feature of the present invention, it is possible to check the amounts of the leakage currents flowing to the ground of the surge protection device and whether the surge protection device is properly installed on the ground line in such a way to use a current and ground state detection sensor.

As further another advantageous feature of the present invention, it is possible to obtain the date and time-based statistic data on the leakage current of a surge protection device, the number of surge occurrences, the levels of surges, the ground states, etc. in such a way to use a current and ground state detection sensor and a surge detection sensor.

Figure 1:
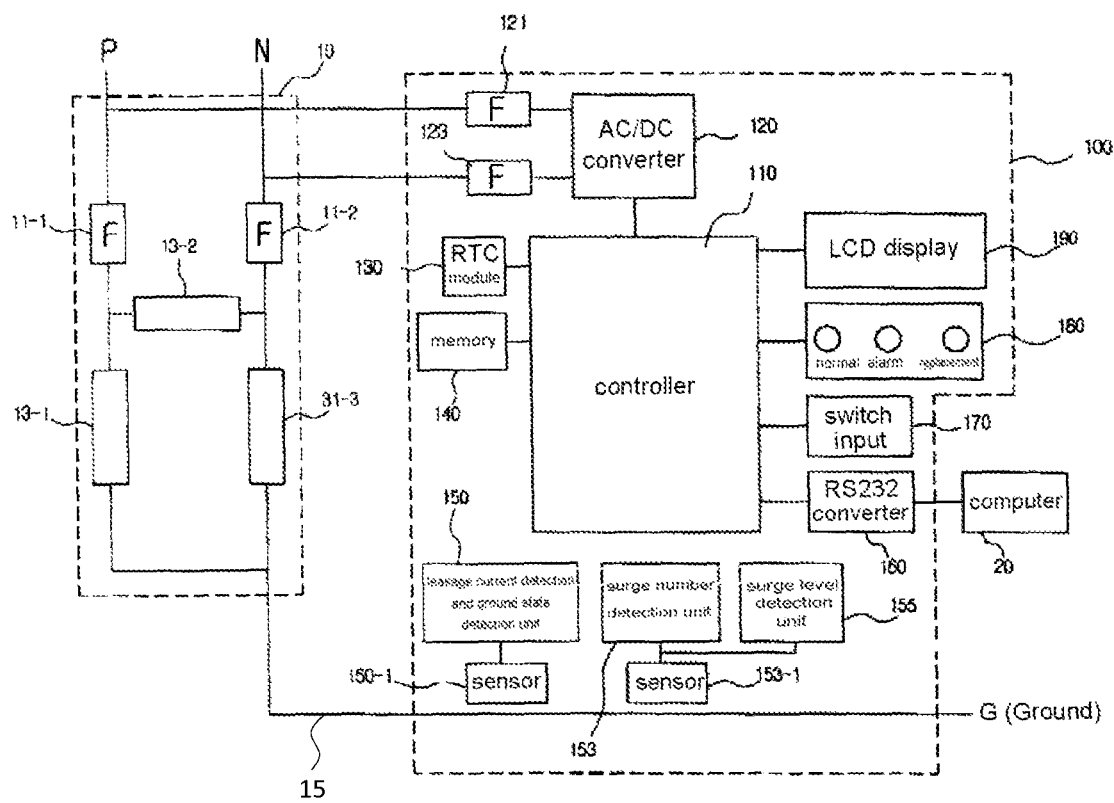
FIG. 1 is a block diagram illustrating a circuit of a device for displaying the lifecycle of a surge protection device according to an embodiment of the present invention.

<Descriptions of Major Elements in the Drawing>

| | |
|---|---|
| 10: surge protection device | 15: ground line |
| 11-1, 11-2: capacitor | |
| 13-1, 13-2, 13-3: surge absorption device | |
| 100: lifespan display device for surge protection device | |
| 110: controller | |
| 120: AC/DC (Alternationg Current/Direct Current) Converter | |
| 121, 123: capacitor | 130: RTC (Real Time clock) Module |
| 140: memory | 150: ground state check circuit unit |
| 150-1: current and ground state detection sensor | |
| 153: surge number detection unit | |
| 153-1: surge detection sensor | 155: surge level detection unit |
| 160: RS232 converter | 170: switch input unit |
| 180: first display unit | 190: second display unit |
| P, N: input line | G: ground |

BEST MODES FOR CARRYING OUT THE INVENTION

The present invention might be modified in various forms along with different embodiments, and the specific embodiments of the present invention will be illustrated in the drawings and will be described in the descriptions of the invention, which is not intended to limit the disclosed embodiments of the present invention and but should be understood that all the changes, equivalents and substitutes are included in the concepts and scopes of the present invention, and the similar elements are given the similar reference numerals in the course of the description of each drawing.

The terms 'first' and 'second' might be used in describing different elements and such descriptions are not limited thereto. The above terms are used so as to distinguish one element from other elements. For example, the first construction element might be named as the second construction element without departing from the scope of the present invention, and in this way the second construction element might be named as the first construction element. The terms 'and/or' are used to represent a combination or one of the elements recited in multiple forms.

The terms reciting that a certain element is 'connected' or 'coupled' to another element represent that they are directly connected or coupled to another element, but it should be understood that they are connected or coupled to it with a certain element disposed between them, and the terms reciting that a certain element is 'directly connected' or 'directly connected' to another element represent that there is not any element between them.

The terms used in the present invention are meant to describe the specific embodiments, not limiting the present invention. A singular form should be meant to include multiple elements unless they are obvious from contexts. In addition, the terms 'comprise' or 'include' are directed to expressing the presence of features, numbers, steps, operations, elements, parts and a combination of them, not intending to exclude the presence or additional possibility of them.

Unless otherwise stated, all the terms including technical and scientific terms throughout the specification should be interpreted to include the same meanings as an ordinary person skilled in the art understands, and the terms defined in the dictionary should be interpreted to have the same meanings as the meanings which can be defined based on the contents of the technical documents. Unless otherwise stated specifically throughout the specification, they should not be interpreted as having an ideal or over formal meanings.

The device and method for displaying the lifestyle of a surge protection device according to an embodiment of the present invention will be described.

FIG. 1 is a block diagram illustrating a circuit of a device for displaying the lifestyle of a surge protection device according to an embodiment of the present invention. As shown in FIG. 1, a surge protection lifestyle display device 100 comprises a detection sensor 150-1, 153-1 detecting a surge protection device, a surge detection unit 150, 153, 155 connected with the detection sensor 150-1, 153-1 for generating a surge input detection information, a controller 110 which receives a surge input detection information, judges the current state of the surge protection device from the surge input detection information and generates a surge protection device state information, and a display unit 180, 190 displaying the surge protection device state information.

The detection sensor 150-1, 153-1 comprises a current and ground sate detection sensor 150-1 checking a leakage current detection and ground state of the surge protection device 10, and a surge detection sensor 153-1 checking the number of surges and the level of surges depending on the input of the surge of the surge protection device 10. The detection sensor 150-1, 153-1 is formed of a current sensor. The current sensor is a hall sensor, a CT (Current Transformer), etc.

It is possible to detect the current flowing from the surge absorption device 13-1, 13-2, 13-3 of the surge protection device 10 to the ground G. In addition, the current values flowing from the surge protection device 10 to the ground G might be different depending on the surge occurrence, the leakage current and the ground state. When the detection sensor 150-1, 153-1 detects the current value, the leakage current, the number of the surges, the level of the surge input and the ground state of the surge protection device 10 can be analyzed. For example, when the current value is 2 mA, it means 'alarm', and when it is 3 mA, it means 'replacement'.

The construction of the surge protection device 10 will be simply described. The surge protection device 10 comprises a surge absorption device 13-1, 13-2, 3-3 like a MOV (Metal Oxide Varistor), and a temperature fuse 11-1, 11-2.

The surge detection unit 150, 153, 155 comprises a leakage current detection and ground state detection unit 150, a surge number detection unit 153 and a surge level detection unit 155. In more details, the leakage current detection and ground state detection unit 150 is connected with the current and ground state detection sensor 150-1, and the surge number detection unit 153 and the surge level detection unit 1500 are connected with the surge detection sensor 153-1. In FIG. 1, the surge number detection unit 153 and the surge level detection unit 155 appear separated for the sake of easier understanding, but they can be integrated.

The surge detection unit 150, 153, 155 generates a surge input detection information as the detection sensor 150-1, 153-1 detects the leakage current, the surge number, the surge input level and the ground state of the surge protection device and transfers the surge input detection information to the controller 110. The surge input detection information includes the leakage current with respect to the surge protection device 10, the number of the surges depending on the inputs of the surges, the surge input level and the ground state.

The controller 110 is formed of a microprocessor, an oscillator and an ADC (Analog to Digital) and is configured to receive and transfer the signal and data for controlling other elements. For example, the controller 110 receives the surge input detection information with respect to the surge protection device 10 that the detection sensor 150-1, 153-1 detects from the surge detection units 150, 153, 155 and compares them with the set values, judges the current state of the surge protection device 10 and generates them as a surge protection device state information. The surge protection device state information is displayed on the display unit 180, 190.

The display unit 180, 190 is configured to display the surge protection device state information in accordance with a control of the controller 110. The display unit 180, 190 comprises a first display unit 180 for displaying a normal, alarm and replacement state of the surge protection device 10 and/or a second display unit 190 for displaying in the form of characters.

The first display unit 180 might be formed of a FND (Flexible Numeric Display), a LED (Light Emitting Diode), etc. The second display unit 190 might be formed of a LCD (Liquid Crystal Display), an OLED (Organic Light Emitting Diode), etc.

The AC/DC (Alternating Current/Direct Current) converter 120 is configured to convert the AC power from the input line P, N into a DC power for thereby supplying them to the controller 110 and other elements. A temperature fuse 121, 123 is connected at a front stage of the AC/DC converter 120 for thereby preventing any fire which might occur due to overheating when over current flows the surge protection device lifecycle device is broken.

The RTC (Real Time Clock) module 130 serves to provide a real time information to the controller 110. So, when the controller 110 receives a surge input detection information from the surge detection unit 150, 153, 155, it calculates the time information along with the surge inlet detection information.

In case of the leakage current, the number of surges and the level of the surge input, the data containing a time information such as a date, a timing, etc. can be generated and transferred to the computer 20. Such transmission can be implemented by way of a wired communication or a wireless communication using the RS232 converter 160.

The memory unit 140 might be formed of a memory provided in the controller 110 or a separate memory. It might be formed of a non-volatile memory such as a hard disk drive, a flash memory, an EEPROM (Electrically Erasable Programmable Read-Only Memory), an SRAM (Static RAM), a FRAM (Ferro-electric RAM), a PRAM (Phase-change RAM), a MRAM (Magnetic RAM), etc. and/or a volatile memory such as a RAM (Random Access Memory), a DRAM (Dynamic Random Access Memory), etc.

The switch input unit 170 serves to display the number of surges or the amount of leakage current. So, the switch input unit 170 is formed of buttons, and the leakage current amount or the number of the surges can be displayed on the display unit 180, 190 depending on the number of the selections of the buttons. For example, when a certain button of the switch input unit 170 is selected one time, it means that the leakage current amount is displayed, and when the button of the switch unit 170 is selected two times, it means that the number of the surges is displayed.

Figure 2:
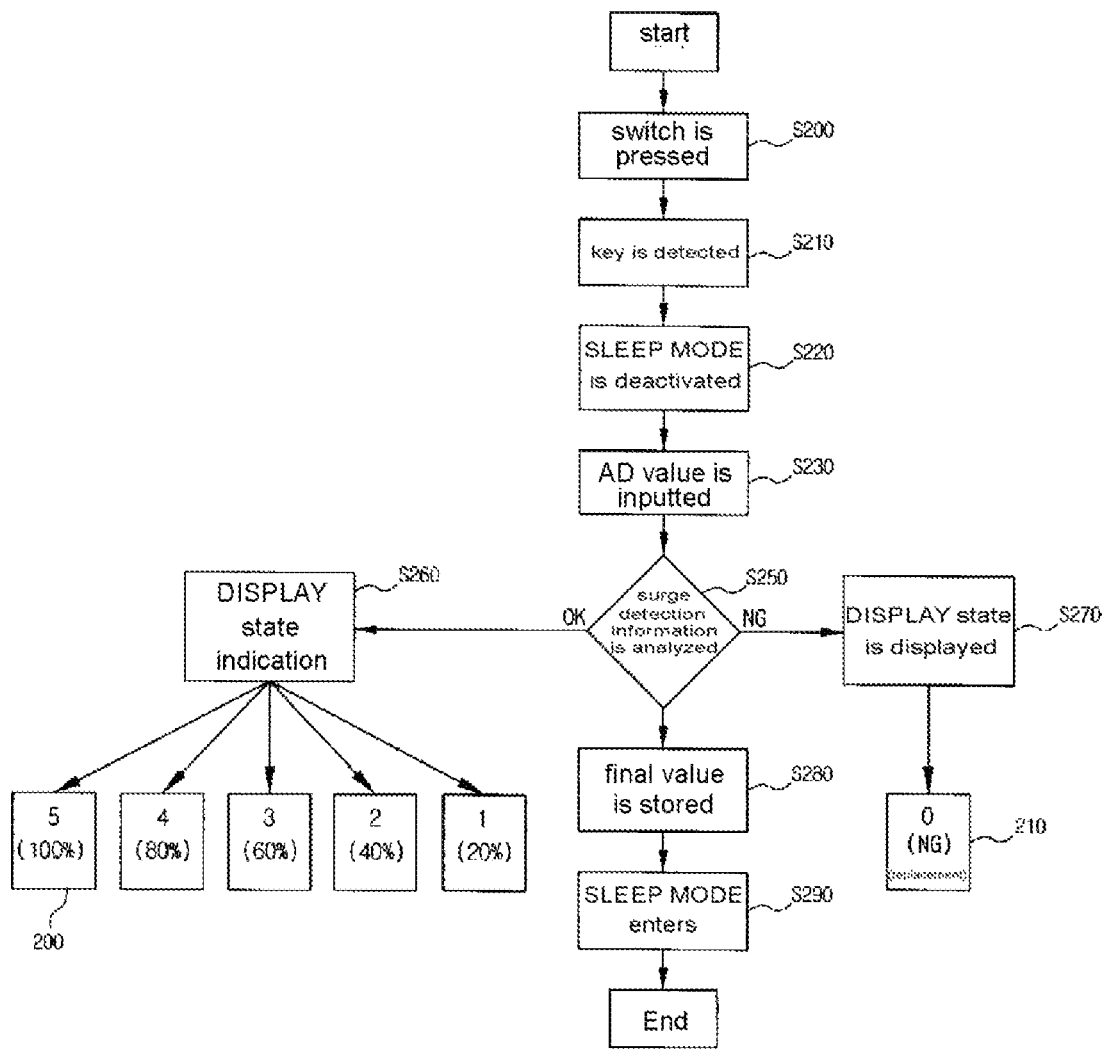
FIG. 2 is a flow chart of a procedure that a lifecycle of a surge protection device is displayed according to an embodiment of the present invention.

FIG. 2 is a flow chart of a procedure that a lifecycle of a surge protection device is displayed according to an embodiment of the present invention. As shown therein, as a user selects the switch input unit (170 of FIG. 1), the controller (110 of FIG. 1) judges whether the key is detected and deactivates the sleep mode (SLEEP MODE) (S200, S210, S220).

In addition, when a user selects the switch input unit 170 on the surge protection device lifecycle display device (100 of FIG. 1), the surge protection device lifecycle display device 100 deactivates the sleep mode and performs a procedure that the surge input detection information generated by the surge detection units (150, 153, 155 of FIG. 1) is converted from the analog information into the digital information.

When the sleep mode is deactivated, the surge protection device lifecycle display device 100 has features in that the surge detection unit 150, 153, 155 converts the surge input detection information of the surge protection device (10 of FIG. 1) generated by the detection sensor (150-1, 153-1 of FIG. 1) from the analog information into the digital information (S230).

When the conversion into the digital information is finished, the controller (110 of FIG. 1) of the surge protection device lifecycle display device analyzes the surge input detection information and calculates the lifespan of the surge protection device (10 of FIG. 1) (S250). In addition, since the surge input detection information contains the information on the level of the surge, the number of surges and the residual voltage, it is possible to calculate the lifespan of the surge protection device by analyzing them. For this operation, it is necessary to store the previously set reference values in the memory (140 of FIG. 1).

As a result of the analysis, when the lifespan of the surge protection device 10 is calculated, it is displayed in five forms (S260). In the step S260, five forms 200 are as follows.
1) First state: 20%
2) Second state: 40%
3) Third state: 60%
4) Fourth state: 80%
5) Fifth state: 100%

Here, % represents the lifespan of the surge protection device 10.

Different from the above, as a result of the analysis, when the lifespan of the surge protection device 10 is calculated to be %, it means the replacement state 210 (S270).

In the step S250, when the lifespan of the surge protection device (10 of FIG. 1) is calculated, and it is displayed on the display unit (180, 190 of FIG. 1), the finally calculated value on the lifespan of the surge protection device 10 is stored in the memory (140 of FIG. 1), and the surge protection device lifecycle display device (100 of FIG. 1) enters the sleep mode (S280, S290).

Figure 3:
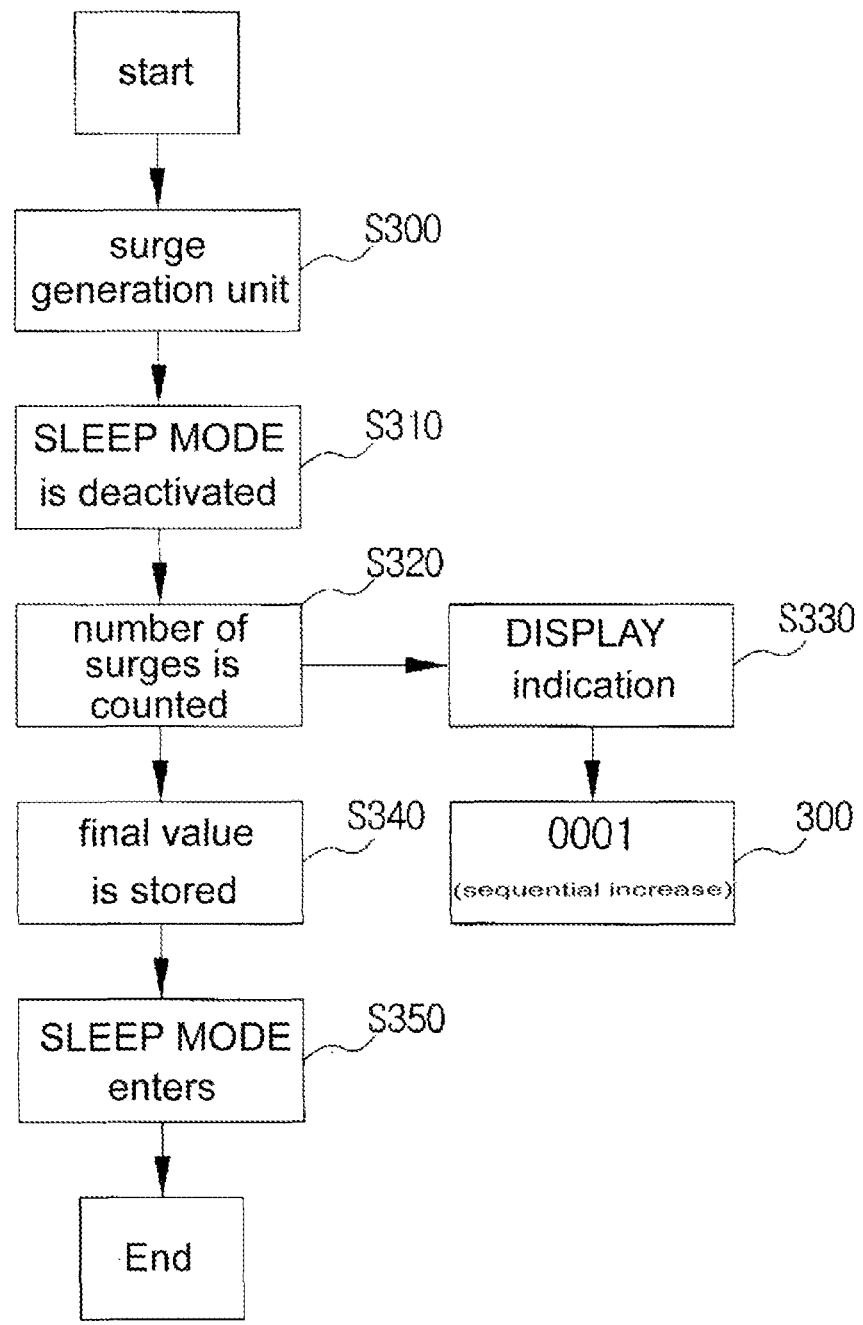
FIG. 3 is a flow chart illustrating a procedure that the number of surge occurrences of a surge protector is counted according to an embodiment of the present invention.

FIG. 3 is a flow chart of a procedure that the number of surges of the surge protection device is counted according to an embodiment of the present invention. Referring to FIG. 3, when the surge voltage is inputted into the surge protection device 10, the surge protection device lifecycle display device (100 of FIG. 1) deactivates the sleep mode (S310).

In most of the electronic devices, they are generally equipped with sleep modes to minimize the energy consumption and maximize the lifespan. In this case, the electronic devices are configured to operate least. So, when a surge voltage is inputted into the surge protection device (10 of FIG. 1), the surge voltage is absorbed by the surge absorption devices (13-1, 13-2, 13-3 of FIG. 1). Part of them flows toward the ground (G of FIG. 1). At this time, the current and ground state detection sensor (153-1 of FIG. 1) detects the occurrence of the surge voltage, and the sleep mode of the surge protection device lifecycle display device 100 is deactivated.

As the sleep mode is deactivated, the number of the surges is counted and accumulatively calculated. The accumulated surge number is displayed on the display unit (180, 190 of FIG. 1) (S320, S330). The above mentioned accumulated surge number is calculated by the sequential increase value 300. FIG. 3 shows an example that '0001' is set as the increase value.

Thereafter, the accumulated surge final value is stored in the memory (140 of FIG. 1), and the surge protection device lifecycle display device (100 of FIG. 1) enters the sleep mode (S350).

FIGS. 2 and 3 are views illustrating an example that the lifespan of the surge protection device is expressed in the forms of the number of surges or numeric forms. For the sake of better understandings, the leakage current, the surge input level and the ground state of the surge protection device can be calculated and displayed.

For example, in case of the ground state, a certain amount of current flows from the surge protection device (10 of FIG. 1) to the ground (G of FIG. 1). If the ground is not connected, the current does not flow. If the current and ground state detection sensor (150-1 of FIG. 1) does not detect the current flowing to the ground (G), the surge protection device lifecycle display device (100 of FIG. 1) displays a ground failure on the display unit (180, 190 of FIG. 1).

Figure 4:
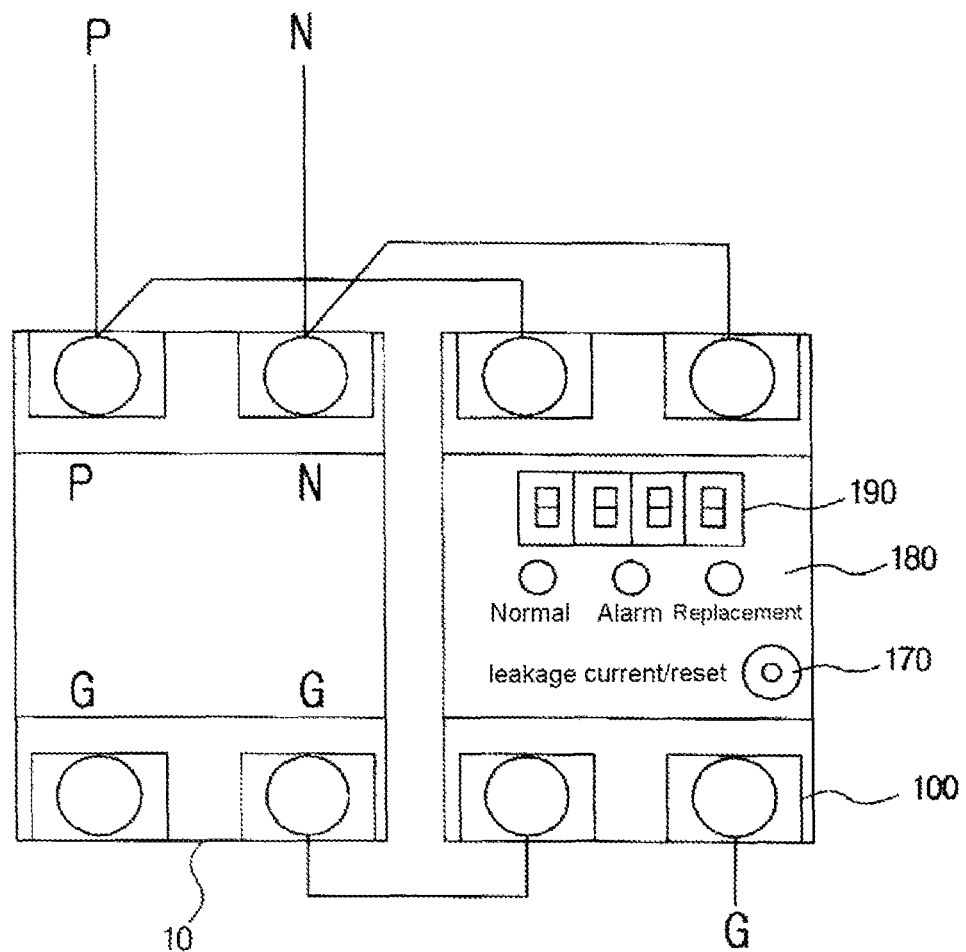
FIG. 4 is a plane view illustrating an application of FIG. 1.

FIG. 4 is a plane view illustrating an application of FIG. 1. As shown in FIG. 4, the left side is the surge protection device 10, and the right side is the surge protection device lifecycle display device 100. The input line P, N is connected to the input terminal of the surge protection device 10 and the input terminal of the surge protection device lifecycle display device 100. In addition, the surge protection device lifecycle display device 100 comprises the display unit 180, 190 and the switch input unit 170.

The invention claimed is:

1. A device for displaying the lifecycle of a surge protection device, comprising:
a ground line directly connecting the surge protection device and the ground;
a surge detection sensor detecting a surge input, the surge input being a current flowing through the ground line;
a surge detection unit connected with the surge detection sensor and generating a surge input detection information, the surge input detection information including a value of the current flowing from the ground line;
a memory storing the surge input detection information and a surge protection device state information;
a controller receiving the surge input detection information from the surge detection unit, judging a present state of the surge protection device using the surge input detection information and generating the surge protection device state information, wherein the surge protection device state information includes a lifespan of the surge protection device, and the controller calculates the lifespan of the surge protection device by comparing the surge input detection information and a predetermined value stored in the memory; and
a display unit displaying the surge protection device state information in a combined form of numbers and characters.

2. The device of claim 1, wherein the surge input detection information further includes at least one among a leakage current of the surge protection device, a ground state and a number of the surge input, and
wherein the surge protection device state information further includes information indicating a normal state, an alarm state and a replacement state, depending on the number of the surge input or the value of the surge input.

3. The device of claim 1, further comprising:
a RTC (Real Time Clock) module providing a time information to the controller;
and
a communication means for externally transmitting the surge input detection information and the surge protection device state information.

4. The device of claim 1, wherein the display unit is formed of any one of a FND (Flexible Numeric Display), a LED (Light Emitting Diode), a LCD (Liquid Crystal Display) and an OLED (Organic Light Emitting Diode).

5. The device of claim 1, further comprising:
an AC/DC (Alternating Current/Direct Current) converter providing an electric power to the controller; and
a temperature fuse connecting an input line of the surge protection device and the AC/DC converter and disconnecting the AC/DC converter from the input line of the surge protection device when a temperature of the temperature fuse exceeds a predetermined level.

6. A method for displaying the lifestyle of a surge protection device, comprising:
   detecting a surge input by a surge detection sensor, the surge input being a current flowing through a ground line, the ground line being directly connecting the surge protection device and the ground;
   generating a surge input detection information by a surge detection unit connected with the surge detection sensor, the surge input detection information including a value of the current flowing through the ground line;
   receiving the surge input detection information by a controller from the surge detection device;
   judging a present state of the surge protection device by the controller using the surge input detection information;
   generating a surge protection device state information by the controller, wherein the surge protection device state information includes a lifespan of the surge protection device, and the controller calculates the lifespan of the surge protection device by comparing the surge input detection information and a predetermined value stored in a memory;
   displaying on a display unit the surge protection device state information in a combined form of numbers and characters; and
   storing in the memory the surge input detection information and the surge protection device state information.

7. The method of claim 6, wherein the surge input detection information further includes at least one among a leakage current of the surge protection device, a ground state and a number of the surge input, and
   wherein the surge protection device state information further includes information indicating a normal, an alarm state and a replacement state, depending on the number of the surge input or the value of the surge input.

8. The method of claim 6, further comprising:
   providing by a RTC (Real Time Clock) module a time information to the controller;
   and
   transmitting by a communication means the surge input detection information and the surge protection device state information to an external device.

9. The method of claim 6, wherein the display unit is formed of any one of a FND (Flexible Numeric Display), a LED (Light Emitting Diode), a LCD (Liquid Crystal Display) and an OLED (Organic Light Emitting Diode.

10. The method of claim 6, further comprising:
   connecting by a temperature fuse an input line of the surge protection device with an AC/DC (Alternating Current/Direct Current) converter; and
   disconnecting by the temperature fuse the input line of the surge protection device with the AC/DC converter when temperature of the temperature fuse exceeds a certain temperature level.

* * * * *